(12) United States Patent
Oikawa

(10) Patent No.: US 7,446,048 B2
(45) Date of Patent: Nov. 4, 2008

(54) DRY ETCHING APPARATUS AND DRY ETCHING METHOD

(75) Inventor: Kota Oikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 217 days.

(21) Appl. No.: 11/028,571

(22) Filed: Jan. 5, 2005

(65) Prior Publication Data

US 2005/0167050 A1 Aug. 4, 2005

(30) Foreign Application Priority Data

Jan. 30, 2004 (JP) .............................. 2004-022825

(51) Int. Cl.
*H01L 21/302* (2006.01)
(52) U.S. Cl. ..................... 438/706; 438/709; 438/710; 438/713; 156/345.25; 156/345.35; 156/345.41; 156/345.47
(58) Field of Classification Search ............ 156/345.25, 156/345.35, 345.41; 438/709, 713
See application file for complete search history.

(56) References Cited

U.S. PATENT DOCUMENTS 6,391,787 B1 * 5/2002 Dhindsa et al. ............. 438/710

FOREIGN PATENT DOCUMENTS

| JP | 61-164271 | 10/1986 |
|---|---|---|
| JP | 61-199039 | 12/1986 |
| JP | 62-73719 | 4/1987 |
| JP | 64-4481 | 1/1989 |
| JP | 3-14228 | 1/1991 |
| JP | 4-184925 | 7/1992 |
| JP | 05-029275 | 2/1993 |
| JP | 7-3133 | 1/1995 |
| JP | 8-339988 A | 12/1996 |
| JP | 09-312268 | 12/1997 |
| JP | 10-189538 | 7/1998 |
| JP | 11-317396 | 11/1999 |

(Continued)

OTHER PUBLICATIONS

Japanese Office Action with English Translation, issued in corresponding Japanese Patent Application No. 2004-022825, issued on Sep. 18, 2007.

(Continued)

*Primary Examiner*—N. Drew Richards
*Assistant Examiner*—Kyoung Lee
(74) *Attorney, Agent, or Firm*—McDermott Will & Emery LLP

(57) ABSTRACT

An etching apparatus of the present invention comprises a reaction chamber, a lower electrode placed on the bottom surface of the reaction chamber, an upper electrode placed at the ceiling of the reaction chamber to face the lower electrode, and a focus ring placed on the lower electrode and having a cavity for holding a to-be-processed substrate. The lower surface of the upper electrode is provided, at its middle part, with a recess having a smaller inside diameter than the diameter of the to-be-processed substrate. Thus, in the generation of plasma, the amount of further incident radicals can be reduced in a middle part of the to-be-processed substrate. Therefore, a hole or the like located in the middle part of the to-be-processed substrate can be formed to have a desired shape without having a tapered shape.

11 Claims, 8 Drawing Sheets

FOREIGN PATENT DOCUMENTS

| | | |
|---|---|---|
| JP | 2000-323456 A | 11/2000 |
| JP | 2000-332000 A | 11/2000 |
| JP | 2001-7090 A | 1/2001 |
| JP | 2001-313286 | 11/2001 |
| JP | 2003-51491 A | 2/2003 |

OTHER PUBLICATIONS

Japanese Office Action issued in corresponding Japanese Patent Application No. JP 2004-022825, dated Mar. 20, 2007.

Chinese Office Action issued in corresponding Chinese Patent Application No. 200510006150.4, dated Dec. 1, 2006.

* cited by examiner

Distribution of Hole Dimensions in Wafer Radius Direction

Dependence of 3σ of Hole Dimensions on Electrode-to-Electrode Distance

DRY ETCHING APPARATUS AND DRY ETCHING METHOD

CROSS-REFERENCE TO RELATED APPLICATIONS

This application claims priority under 35 U.S.C. §119 on Patent Application No. 2004-22825 filed in Japan on Jan. 30, 2004, the entire contents of which are hereby incorporated by reference.

BACKGROUND OF THE INVENTION (1) Field of the Invention

The present invention relates to a dry etching apparatus and a dry etching method.

(2) Description of Related Art

FIG. 10 schematically shows the structure of a known dry etching apparatus for use in etching of oxide films or other films.

As shown in FIG. 10, a lower electrode 102 is provided on the bottom of a reaction chamber 101, and an upper electrode 110 is provided at the ceiling of the reaction chamber 101 to face the lower electrode 102. The lower electrode 102 and upper electrode 110 are separated from each other by as large a space as necessary to generate plasma. A focus ring 108 is placed on the lower electrode 102 to hold a to-be-processed substrate 103. The focus ring 108 has, at its middle part, a cavity for holding the to-be-processed substrate 103.

An RF power supply 104 is provided outside of the reaction chamber 101 to apply voltage to the lower electrode 102. The RF power supply 104 applies power at 13.56 MHz to the lower electrode 102. On the other hand, the upper electrode 110 is connected to a ground potential 107. A gas inlet 105 is provided at the top of the upper electrode 110 to introduce a process gas into the reaction chamber 101. The process gas is supplied through the gas inlet 105 and an unshown conduit passing through the upper electrode 110 into the reaction chamber 101. On the other hand, a gas outlet 106 is provided at the lower part of the reaction chamber 101 to let out the process gas from the reaction chamber 101.

Next, a dry etching method using the known dry etching apparatus as shown in FIG. 10 will be described with reference to FIG. 11. A description will now be given of, as an example, a process step of forming a contact hole in an interlayer insulating film by using a silicon nitride (SiN) film as an etching stopper. FIG. 11 is a cross sectional view showing the state of an SRAM memory cell where a contact hole for electrically connecting an upper interconnect to a substrate is formed partway between two of adjacent gate electrodes.

As shown in FIG. 11, in a semiconductor device before the process step of forming a contact hole, a gate oxide film 115 formed by thermal oxidation and a gate electrode 118 located thereon are placed on the top surface of a silicon substrate 117 in which a well or isolation is previously formed. While an offset oxide film 113 is formed on the top surface of the gate electrode 118, a sidewall consisting of a film 116 of L-shaped cross section and a coating film 120 located on the L-shaped film 116 is formed on the side surface of the gate electrode 118. Furthermore, unshown source/drain regions each having an LDD structure are provided in the surface of the silicon substrate 117. More particularly, there are provided unshown extension diffusion layers self-aligned with the gate electrode 118 and source/drain regions self-aligned with the sidewall.

In this state, a SiN etching stopper film 114 is formed on the silicon substrate 117 to cover the offset oxide film 113 and the surface of the sidewall. An interlayer insulating film 112 made of $SiO_x$ (x=1, 2 . . . ) is deposited on the SiN etching stopper film 114. Thereafter, the surface of the interlayer insulating film 112 is planarized. Subsequently, a resist pattern 119 is formed on the interlayer insulating film 112 by photolithography. Next, the interlayer insulating film 112 is subjected to dry etching using the resist pattern 119 as a mask. When the selectivity of $SiO_x$ constituting the interlayer insulating film 112 to the SiN etching stopper film 114 is large enough during this dry etching, the etching rate rapidly decreases at the moment that a contact hole passes through the interlayer insulating film 112 and reaches the SiN etching stopper film 114. At this moment, if the process is switched to etching conditions on which SiN can selectively be removed, a contact hole can be completed.

However, SiN and $SiO_x$ have the following etching characteristics. The energy of chemical bonds of atoms constituting a crystal lattice of SiN is similar to that of $SiO_x$, and SiN and $SiO_x$ have basically the same etching species. In addition, when fluorine radicals are used for etching, the etching rate of SiN is a little faster than that of $SiO_x$. In view of these points, the high-selectivity etching of a $SiO_x$ film using SiN as an etching stopper film is considered to have an extremely high difficulty level.

The currently dominating method for dry etching of interlayer insulating films is a method in which a CF-based polymer is formed using plasma of a fluorocarbon-based gas to ensure the selectivity. The use of a fluorocarbon-based gas permits the generation of a CF-based polymer, and the CF-based polymer is deposited on the surface of the underlying interlayer insulating film to form a CF-based protective film. In order to compensate for decrease in the etching rate of the interlayer insulating film due to the deposition of the CF-based protective film, a large amount of etching species are generated in high-density plasma. In this way, in order to obtain a high selectivity, it is very important to generate high-density plasma.

The dry etching apparatus shown in FIG. 10 has been demanded to have improved uniformity of the etching rate. To meet this demand, a method has been suggested in which an upper electrode is curved to have a concave shape (see Japanese Unexamined Patent Publication No. 11-317396). The reason for this is as follows. Reaction products are likely to be deposited on the peripheral part of a to-be-processed substrate in a reaction chamber due to the convection of an etching gas. Since the etching rate is therefore decreased in the peripheral part of the to-be-processed substrate, this deteriorates the uniformity of the etching rate of the whole to-be-processed substrate. To cope with this, as disclosed in Japanese Unexamined Patent Publication No. 11-317396, the upper electrode is curved to have a concave shape, and thus the electrode-to-electrode distance is shortened in the peripheral part of the to-be-processed substrate. In this way, the etching rate of the peripheral part can be enhanced. Thus, the etching rate of the peripheral part of the to-be-processed substrate can be made substantially equal to that of the middle part of the to-be-processed substrate. In other words, the uniformity of the etching rate can be enhanced by curving the upper electrode to have a concave shape.

By the way, in recent years, in order to increase the number of obtainable devices per substrate and reduce cost, the diameter of a to-be-processed substrate has been increased. With the increase in the diameter of the to-be-processed substrate, the diameters of electrodes in an etching apparatus become larger.

Meanwhile, high integration of semiconductor devices has provided finer design rules, and in order to more precisely perform etching, the controllability of plasma to be generated during etching must be enhanced. To meet this demand, the electrode-to-electrode distance in an etching apparatus need be shortened.

As can be seen from the above, while the diameters of electrodes tend to increase, the electrode-to-electrode distance is becoming shorter. However, the use of such an etching apparatus causes an inconvenience as described hereinafter. FIGS. 12A through 12C are cross-sectional views for explaining a problem on the formation of a contact hole in a large-diameter to-be-processed substrate under the use of an etching apparatus having a small electrode-to-electrode distance.

As shown in FIG. 12A, a resist pattern 122 having an opening 123 of, for example, a contact hole pattern is formed on an oxide film 121 serving as an object to be etched. In this case, the diameter of the opening (dimension after lithography) in the resist pattern 122 is represented as L0.

The oxide film 121 as shown in FIG. 12A is etched using the resist pattern 122 as a mask, thereby forming a contact hole in the oxide film 121. FIG. 12B illustrates the shape of a contact hole 123a on the middle part of the to-be-processed substrate, and FIG. 12C illustrates the shape of a contact hole 123b on a peripheral part of the to-be-processed substrate. In FIGS. 12B and 12C, the respective diameters of the tops of the opened contact holes (dimensions after dry etching) are represented as L1 and L1' and the respective diameters of the bottoms thereof as L2 and L2'.

With the use of the known dry etching apparatus, the contact hole 123a on the middle part of the to-be-processed substrate is tapered as shown in FIGS. 12B and 12C. As a result, the inside diameter of the contact hole becomes smaller with the increase in depth. This deteriorates the uniformity of the hole diameters in the surface region of the to-be-processed substrate.

SUMMARY OF THE INVENTION

An object of the present invention is to improve the uniformity of etching shape in a substrate surface region even under the use of an etching apparatus having a small electrode-to-electrode distance to obtain a desired etching shape. More specifically, an object of the present invention is to prevent, in the formation of contact holes on a large diameter to-be-processed substrate using an etching apparatus having a small electrode-to-electrode distance, a contact hole on the middle part of the to-be-processed substrate from having a tapered shape to obtain contact holes of desired shape.

In order to achieve the above object, the present inventor studied causes of deteriorating the uniformity of hole dimensions in the substrate surface region when dry etching is performed on a large-diameter to-be-processed substrate by an etching apparatus having a small electrode-to-electrode distance. As a result, the present inventor obtained the following finding.

FIG. 13 is a graph illustrating the relationship between the ratio of the electrode-to-electrode distance L to the diameter S of a to-be-processed substrate and 3σ (σ: standard deviation) of hole dimensions in the known etching apparatus.

As shown in FIG. 13, for example, when S=200 mm and L=25 mm (L/S=0.125), the dispersion 3σ of the hole dimensions after etching in the to-be-processed substrate surface region is approximately 20 nm. Typically, 10 percent of the design rule of a hole diameter is allowable as the dispersion. Thus, a hole diameter of approximately 0.2 μm has no problem as long as the dispersion in the to-be-processed substrate surface region falls within 20 nm.

However, for example, when S=300 mm and L=25 mm (L/S≈0.083), the dispersion 3σ in the to-be-processed substrate surface region is approximately 30 nm. In this case, the ever-decreasing hole diameter cannot be coped with. For example, when the hole diameter is 0.15 μm, the dispersion in the to-be-processed substrate surface region is beyond its allowable range.

The present inventor found that when a pair of electrodes is provided in a reaction chamber and an oxide film is etched using an etching apparatus having a smaller electrode-to-electrode distance than the radius of each electrode, the dispersion in the to-be-processed substrate surface region is significant. More particularly, due to a small electrode-to-electrode distance, the period during which plasma particles desorb from the to-be-processed substrate, are reflected by an upper electrode and then are again incident on the to-be-processed substrate becomes much shorter than the gaseous residence time. This increases an influence of the further incidence of plasma particles on the middle part of the to-be-processed substrate and thus polymer-deposition-causing fluorocarbon radicals, i.e., deposition species, become excessive. As a result, even if the etching rate is uniform, there arises an inconvenience that the controllability of the etching shape in the middle part of the to-be-processed substrate (hereinafter, referred to as shape controllability) is deteriorated.

In order to solve such a problem, a dry etching apparatus of a first aspect of the present invention comprises: a reaction chamber; a lower electrode placed in the reaction chamber; an upper electrode placed in the reaction chamber to face the lower electrode; and a substrate-fixing member composed of a ring placed in the reaction chamber and on the surface of the lower electrode facing the upper electrode, said substrate-fixing member allowing a to-be-processed substrate to be fixed inside the ring, wherein the surface of the upper electrode facing the lower electrode is provided with a recess with a smaller inside diameter than that of the substrate-fixing member.

Since in this way the recess is provided only in the middle part of the upper electrode, the amount of further incident plasma particles can be made uniform between the peripheral part and middle part of the to-be-processed substrate. Therefore, a desired etching shape can be realized while an excellent controllability of the hole dimensions after etching is kept.

The distance between the upper electrode and the lower electrode may be shorter than the smaller of the radii of the upper and lower electrodes. In this case, while the difference in dimension between the peripheral part and middle part of the to-be-processed substrate is increased in the conventional case, the present invention can provide excellent dimensions.

The recess may have a dome shape in which the depth becomes shallower with increase in distance from the center of the upper electrode. In this case, since no projection or depression exists in the upper electrode, the convection of plasma particles is not caused, resulting in enhanced dimensional controllability.

The upper electrode has a middle part and a peripheral part surrounding the side face of the middle part, said middle and peripheral parts permitting adjustment of their distances from the lower electrode independently of each other, and the recess may be provided by making the distance between the middle part and the lower electrode longer than the distance between the peripheral part and the lower electrode. In this case, a high dimensional controllability can always be kept in accordance with etching conditions.

The dry etching apparatus is preferably used under the condition that the time of residence of an etching gas in the reaction chamber is longer than the period during which plasma particles caused by etching are again incident on the lower electrode.

The upper electrode is preferably made of at least one substance of silicon (Si), quartz ($SiO_2$), silicon carbide (SiC), aluminum oxide ($Al_2O_3$), aluminum (Al) and yttrium oxide ($Y_2O_3$).

A dry etching apparatus of a second aspect of the present invention comprises: a reaction chamber; a lower electrode placed in the reaction chamber; an upper electrode placed in the reaction chamber to face the lower electrode; and a substrate-fixing member composed of a ring placed in the reaction chamber and on the surface of the lower electrode facing the upper electrode, said substrate-fixing member allowing a to-be-processed substrate to be fixed inside the ring, wherein the upper electrode comprises a middle part having a smaller diameter than the inside diameter of the substrate-fixing member and a peripheral part made of a material exhibiting a higher etchant scavenging ability than that of the middle part, said peripheral part surrounding the side surface of the middle part. In this case, a collision of plasma particles with the upper electrode removes more plasma particles in the middle part of the upper electrode than in the peripheral part thereof. Therefore, the amount of radicals that are again incident from the upper electrode to the middle part of the to-be-processed substrate can be reduced as compared with the known etching apparatus, and the amount of further incident plasma particles can be made uniform between the peripheral part and middle part of the to-be-processed substrate. Accordingly, a desired etching shape can be realized while an excellent controllability of the hole dimensions after etching is always kept.

The dry etching apparatus is preferably used under the condition that the time of residence of an etching gas in the reaction chamber is longer than the period during which plasma particles caused by etching are again incident on the lower electrode.

The upper electrode is preferably made of at least one substance of silicon (Si), quartz ($SiO_2$), silicon carbide (SiC), aluminum oxide ($Al_2O_3$), aluminum (Al) and yttrium oxide ($Y_2O_3$).

A dry etching method of the present invention using the dry etching apparatus of the first and second aspects comprises the steps of: (a) mounting the to-be-processed substrate on the substrate-fixing member; and (b) performing dry etching by generating plasma between the upper electrode and the lower electrode with an etching gas introduced into the reaction chamber wherein the dry etching method further comprises, before the step (b), the step of adjusting the distance between the upper electrode and the lower electrode in accordance with the time of residence of the etching gas and the period during which plasma particles caused by etching are again incident on the lower electrode.

In this case, a high dimensional controllability can always be kept in accordance with etching conditions.

Herein, "having a certain material as a main component" includes "consisting of only a certain material".

DETAILED DESCRIPTION OF THE INVENTION

Embodiment 1

Figure 1:
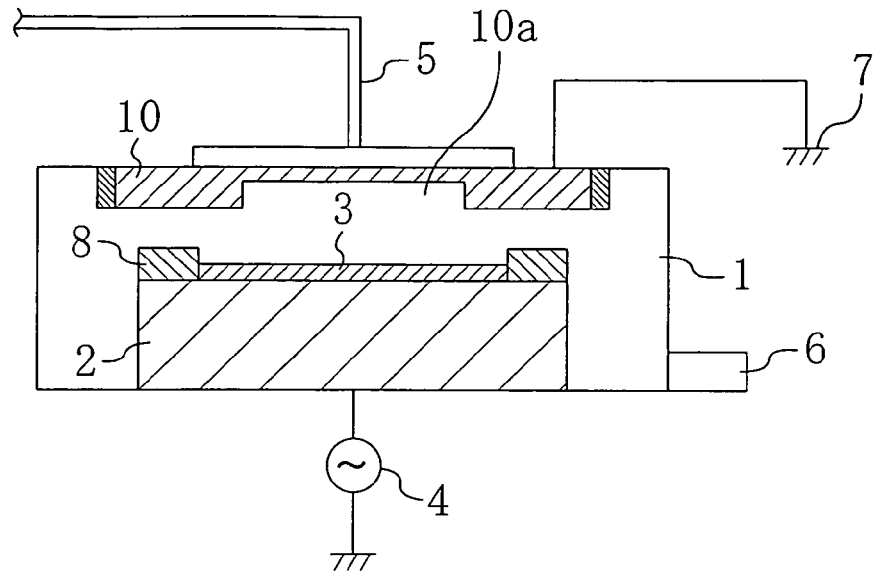
FIG. 1 is a schematic view showing the structure of a dry etching apparatus according to a first embodiment.

A dry etching apparatus and method according to a first embodiment of the present invention will be described hereinafter with reference to the drawings. Etching for forming a contact hole in an oxide film will now be given as an example. FIG. 1 is a schematic view showing the structure of a dry etching apparatus according to the first embodiment.

As shown in FIG. 1, a lower electrode 2 is provided on the bottom of a reaction chamber 1, and an upper electrode 10 is provided at the ceiling of the reaction chamber 1 to face the lower electrode 2. The lower electrode 2 and upper electrode 10 are separated from each other by as large a space as necessary to generate plasma.

A focus ring 8 is placed on the lower electrode 2 to hold a to-be-processed substrate (wafer) 3. The focus ring 8 has, at its center, a cavity for holding the to-be-processed substrate 3.

An RF power supply 4 is provided outside of the reaction chamber 1 to apply voltage to the lower electrode 2. The RF power supply 4 applies power at 13.56 MHz to the lower electrode 2. On the other hand, the upper electrode 10 is connected to a ground potential 7.

A gas inlet 5 is provided at the top of the upper electrode 10 to introduce a process gas into the reaction chamber 1. The process gas is supplied through the gas inlet 5 and an unshown conduit passing through the upper electrode 10 into the reaction chamber 1. On the other hand, a gas outlet 6 is provided at the lower part of the reaction chamber 1 to let out the process gas from the reaction chamber 1.

Although not shown, a silicon oxide film serving as an etching object is formed over the to-be-processed substrate 3 with an etching stopper film, such as a silicon nitride film, interposed therebetween.

Figure 2:
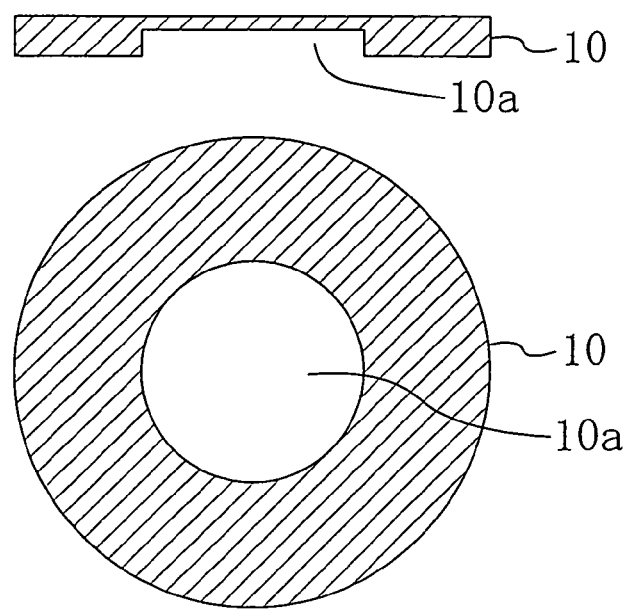
FIG. 2 are a cross-sectional view and a plan view showing the structure of an upper electrode 10 shown in FIG. 1.

FIG. 2 are a cross-sectional view showing the structure of the upper electrode 10 shown in FIG. 1 and a plan view showing the side of the upper electrode 10 in which a recess is formed. As shown in FIG. 2, this embodiment is characterized by providing a recess 10*a* to make a middle part of the upper electrode 10 thinner than the other parts thereof. Specifically, the recess 10*a* is formed in the middle part of the upper electrode 10 having an outside diameter of 20 cm and a thickness of 20 mm to have an inside diameter of 10 cm and a depth of 5 mm. The inside diameter of the recess 10*a* is set smaller than the inside diameter of the focus ring 8. The inside diameter of the focus ring 8 is set to coincide with the outside diameter of the to-be-processed substrate 3. That is, it can be said that the inside diameter of the recess 10*a* is set smaller than the outside diameter of the to-be-processed substrate 3. The upper electrode 10 contains silicon as a main component.

Hereinafter, a method for dry-etching an oxide film using the above-mentioned dry etching apparatus will be specifically described again with reference to FIG. 1. First, a fluorocarbon gas (reactive gas) such as a $C_4F_8$, $C_5F_8$ or $CF_4$ gas, an Ar gas and an oxygen gas are supplied into the reaction chamber 1 through the gas inlet 5. Then, voltage is applied to the lower electrode 2, thereby generating plasma made of these gases. An oxide film over the to-be-processed substrate 3 is then etched using the plasma. Specific etching conditions in this case are, for example, as follows: the flow rate of $C_4F_8$ is 10 ml/min (under standard conditions); the $O_2$ flow rate is 5 ml/min (under standard conditions); the Ar flow rate is 400 ml/min (under standard conditions); the pressure in the chamber is 7 Pa; the RF power for plasma generation is 1500 W; and the substrate temperature is 20° C.

Figure 3:
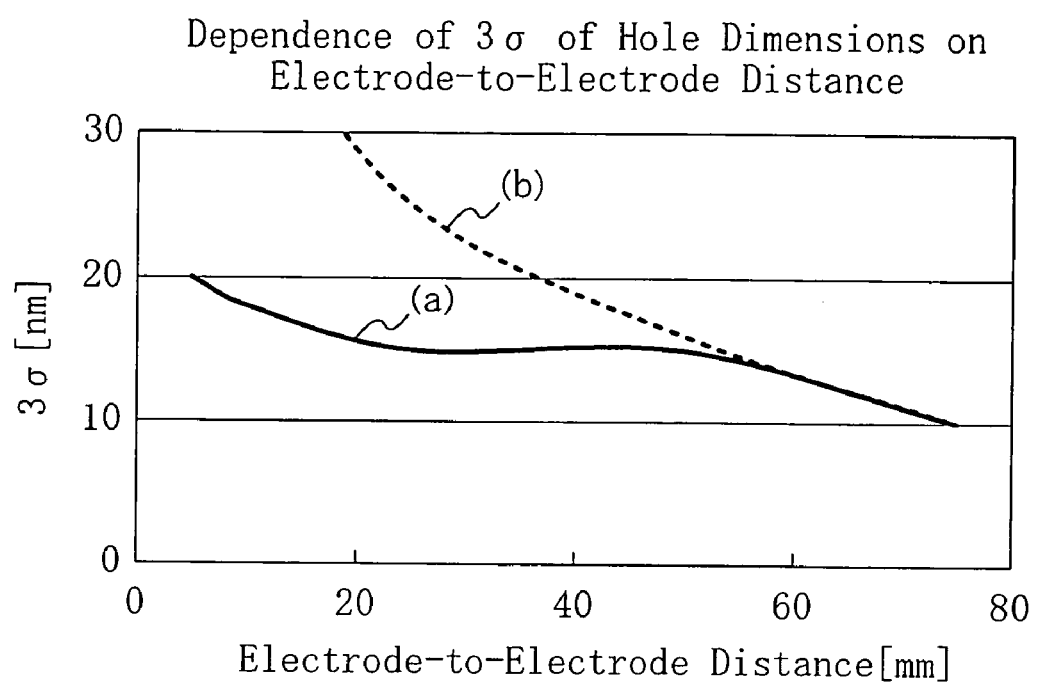
FIG. 3 is a graph showing how 3σ of hole dimensions varies when etching is performed with the change in the electrode-to-electrode distance in each of a known etching apparatus and an etching apparatus of the first embodiment.

Next, the accuracy of the dimensions of holes formed by a dry etching method of this embodiment will be described with reference to FIG. 3. FIG. 3 is a graph showing how 3σ of hole dimensions varies when etching is performed with the change in the electrode-to-electrode distance in each of a known etching apparatus and an etching apparatus of the first embodiment. In FIG. 3, the abscissa represents the electrode-to-electrode distance, and the ordinate represents 3σ of the bottom diameter of a hole after etching. The curve (a) shows the result obtained by measuring 3σ in the etching apparatus of this embodiment, and the curve (b) shows the result obtained by measuring 3σ in the known etching apparatus. An etching apparatus having a flat-shaped upper electrode is used as the known etching apparatus. The electrode-to-electrode distance in the etching apparatus of this embodiment means the length between the region of the upper electrode 10 other than a recess thereof and the lower electrode 2.

When etching is performed using the known flat-shaped upper electrode, as shown in the curve (b) in FIG. 3, the value of 3σ increases with the decrease in the electrode-to-electrode distance. On the other hand, when etching is performed using the upper electrode 10 of this embodiment, as shown in the curve (a) in FIG. 3, even an electrode-to-electrode distance of approximately 10 mm can provide an excellent value of 3σ. Thus, it can be found that even if the electrode-to-electrode distance becomes short, the shape of the hole can be controlled. The reason for this is as follows.

In the plasma, the gases introduced into the reaction chamber 1 are dissociated, thereby generating $C_xF_y$ radicals (fluorocarbon radicals) serving as a deposition species and F radicals (fluorine radicals) serving as an etchant. These radical particles include those reacting on the to-be-processed substrate 3, those reflected by the to-be-processed substrate 3 and delivered to the outside of the chamber, and those which are reflected by the upper electrode 10 after being reflected by the to-be-processed substrate 3 and are again incident on the to-be-processed substrate 3 or delivered to the sides of the to-be-processed substrate 3.

Conventionally, the proportion of particles that are again incident on the to-be-processed substrate becomes larger at the middle part of the to-be-processed substrate than at the peripheral part thereof. In this case, the difference in the amount of further incident particles between the peripheral and middle parts of the to-be-processed substrate depends on the ratio between the electrode-to-electrode distance and the electrode radius. The electrode radius means the radius of an electrode having a smaller radius out of the upper and lower electrodes and represents the radius of the lower electrode herein. That is, the difference in the amount of further incident particles increases with reduction in the electrode-to-electrode distance or with increase in the electrode radius. Therefore, in particular, when the electrode-to-electrode distance is wider than the electrode radius, the difference in the amount of further incident particles becomes large.

On the other hand, in this embodiment, as described above, the recess 10*a* is formed at the middle part of the lower surface of the upper electrode 10 (the surface of the upper electrode 10 facing the lower electrode 2). In this way, the distance between the upper and lower electrodes can be extended only at the middle parts of the electrodes. Therefore, the amount of further incident plasma particles can be uniform in both the peripheral and middle parts of the to-be-processed substrate 3. Hence, a desired etching shape can be realized while an excellent controllability of the hole dimensions after etching is kept. The "electrode-to-electrode distance is short" herein specifically means that the electrode-to-electrode distance is shorter than the electrode radius. In this embodiment, a description was given of an example in which the upper electrode 10 has an outside diameter of 20 cm and a thickness of 20 mm and a region of the upper electrode 10 located in a circle with a distance of 5 cm from the center thereof is recessed 5 mm. However, in the invention of this embodiment, the depth of the recess 10*a* of the upper electrode 10 is not specifically limited. The radius of the recess 10*a* is also not specifically limited as long as it is smaller than the radius of the to-be-processed substrate 3.

In this embodiment, silicon is used as the main component of the upper electrode 10. However, even if the other materials are used as the main component of the upper electrode 10, the same effects as in this embodiment can be obtained.

In this embodiment, $C_4F_8$ is used as a reactive gas (gas for plasma generation) for oxide-film etching. However, in this embodiment, the type of the gas for plasma generation is not limited and may be a gas containing at least one of, for example, $CF_4$, $CHF_3$, $CH_2F_2$, $CH_3F$, $C_4F_8$, $C_5F_8$, $C_4F_6$ and $C_2F_6$.

Embodiment 2

Figure 4:
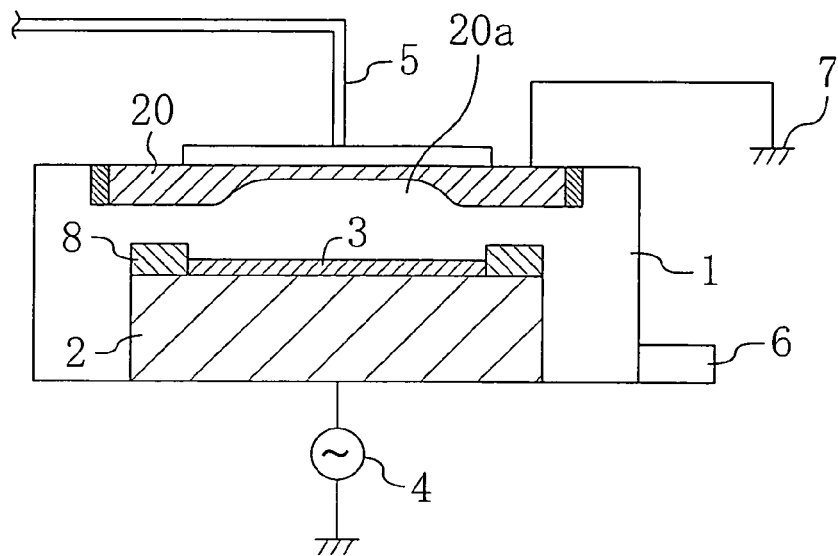
FIG. 4 is a schematic view showing the structure of a dry etching apparatus according to a second embodiment.

A dry etching apparatus and method according to a second embodiment of the present invention will be described hereinafter with reference to the drawings. Etching for forming contact holes in an oxide film will be described below as an example. FIG. 4 is a schematic view showing the structure of a dry etching apparatus according to the second embodiment. In FIG. 4, the same reference numerals are given to the same members as those of the dry etching apparatus shown in FIG. 1 of the first embodiment.

The second embodiment is different from the first embodiment in the structure of an upper electrode 20. To be specific, a dome-shaped recess 20a with an inside diameter of 15 cm is formed in the middle part of the upper electrode 20 having an outside diameter of 20 cm and a thickness of 20 mm. The dome-shaped recess 20a has a maximum depth of 5 mm in its middle part, i.e., in the middle part of the upper electrode 20 and becomes shallower with the increase in distance from its middle part. In this embodiment, the upper electrode 20 is made of a material having silicon as the main component. Although not shown in FIG. 4, a silicon oxide film to be etched is formed on a to-be-processed substrate 3, for example, with a silicon nitride film interposed therebetween.

Next, a dry etching method using the above-mentioned dry etching apparatus will be described specifically again with reference to FIG. 4. First, a fluorocarbon gas (reactive gas) such as $C_4F_8$, $C_5F_8$ or $CF_4$, an Ar gas and an oxygen gas are supplied into a gas inlet 5. Then, voltage is applied to a lower electrode 2, thereby generating plasma made of these gases. An oxide film over a to-be-processed substrate 3 is then etched. Specific etching conditions in this case are, for example, as follows: the flow rate of $C_4F_8$ is 10 ml/min (under standard conditions); the $O_2$ flow rate is 5 ml/min (under standard conditions); the Ar flow rate is 400 ml/min (under standard conditions); the pressure in the chamber is 7 Pa; the RF power for plasma generation is 1500 W; and the substrate temperature is 20° C.

In the plasma, the gases introduced into the reaction chamber 1 are dissociated, thereby generating $C_xF_y$ radicals (fluorocarbon radicals) serving as a deposition species and F radicals (fluorine radicals) serving as an etchant. These radical particles include those reacting on the to-be-processed substrate 3, those reflected by the to-be-processed substrate 3 and delivered to the outside of the chamber, and those which are reflected by the upper electrode 10 after being reflected by the to-be-processed substrate 3 and are again incident on the to-be-processed substrate 3 or delivered to the sides of the to-be-processed substrate 3.

Conventionally, the proportion of particles that are again incident on the to-be-processed substrate becomes larger at the middle part of the to-be-processed substrate than at the peripheral part thereof. In this case, the difference in the amount of further incident particles between the peripheral and middle parts of the to-be-processed substrate depends on the ratio between the electrode-to-electrode distance and an electrode radius. That is, the difference in the amount of further incident particles increases with reduction in the electrode-to-electrode distance or with increase in the electrode radius. Therefore, in particular, when the electrode-to-electrode distance is wider than the electrode radius, the difference in the amount of further incident particles becomes large.

On the other hand, in this embodiment, as described above, the recess 20a is formed at the middle part of the lower surface of the upper electrode 20 (the surface of the upper electrode 20 facing the lower electrode 2). In this way, the distance between the upper and lower electrodes can be extended only at the middle parts of the electrodes. Therefore, the amount of further incident plasma particles can be uniform in both the peripheral and middle parts of the to-be-processed substrate 3. Hence, a desired etching shape can be realized while an excellent controllability of the hole dimensions after etching is kept.

Furthermore, since in this embodiment the upper electrode 20 does not have projections or depressions with right-angle shapes in cross section, this can prevent the convection of plasma particles due to the projections or depressions and resultant deterioration in plasma controllability. This will be described below.

Figure 5:
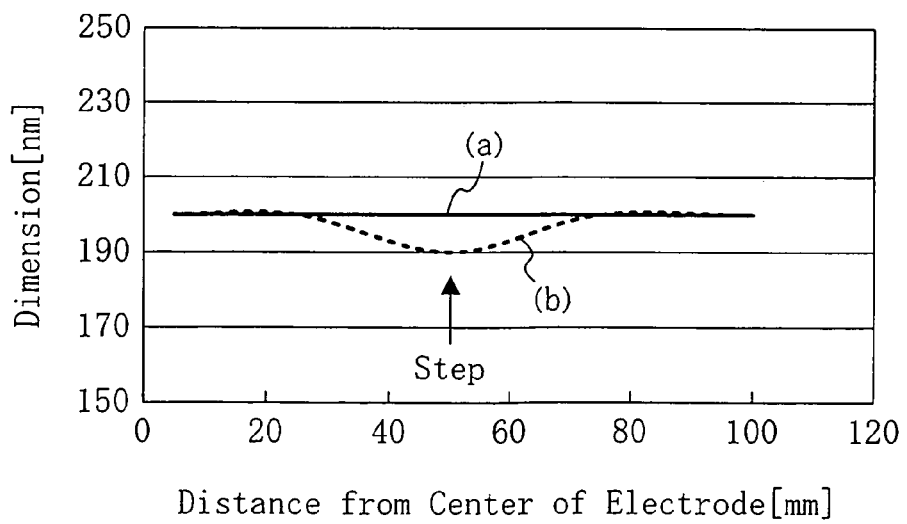
FIG. 5 is a graph showing the distribution of hole dimensions after etching in a wafer radius direction when etching is performed under the conditions of the second embodiment.

FIG. 5 is a graph showing the distribution of hole dimensions after etching in a wafer radius direction when etching is performed under the conditions of this embodiment. In the graph of FIG. 5, the abscissa represents a distance from the middle part of an electrode, and the ordinate represents the bottom diameter of each of holes formed by etching. The curve (a) shows the result obtained by measuring the hole dimensions in the etching apparatus of this embodiment, and the curve (b) shows the result obtained by measuring the dimensions in the etching apparatus of a comparative example. Referring to FIG. 5, as the comparative example, an etching apparatus is used which is provided with a recess 10a in the middle part of an upper electrode 10 having an outside diameter of 20 cm and a thickness of 20 mm as shown in the first embodiment. The recess 10a has an inside diameter of 10 cm and a depth of 10 mm and right-angle shapes in cross section at its corners. In the etching apparatus of the comparative example, the side surfaces of the recess 10a of the upper electrode 10 are formed to be perpendicular to the bottom surface of the recess 10a. In both the etching apparatus of this embodiment and the etching apparatus of the comparative example, etching was performed under the above-mentioned conditions.

In the measurement result of the comparative example, as shown in the curve (b) of FIG. 5, the hole dimensions become smaller in a part of the wafer located below a steep step part of the upper electrode than those in the other parts thereof. On the other hand, in the measurement result of this embodiment, as shown in the curve (a) of FIG. 5, the hole dimensions are substantially the same in any position. The reason for this is considered as follows. While in the etching apparatus of the comparative example the convection of plasma particles is caused in a steep step part of the upper electrode and thus affects the wafer, the upper electrode 20 of this embodiment is provided with the dome-shaped recess 20a having a smooth peripheral shape, leading to no convection of plasma particles. As a result, in the etching apparatus of this embodiment, dimensional controllability is totally enhanced.

In this embodiment, a description was given of an example in which the upper electrode 20 has an outside diameter of 20 cm and a thickness of 20 mm and is provided, at its middle part, with the dome-shaped recess 20a that has an inside diameter of 15 cm and is recessed 5 mm at its deepest part. However, in the invention of this embodiment, the depth of the recess 20a of the upper electrode 20 is not specifically limited. The radius of the recess 20a is also not specifically limited as long as it is smaller than the radius of the to-be-processed substrate 3.

In this embodiment, silicon is used as the main component of the upper electrode 20. However, even if the other materials are used as the main component of the upper electrode 20, the same effects as in this embodiment can be obtained.

In this embodiment, $C_4F_8$ is used as a reactive gas (gas for plasma generation) for oxide-film etching. However, in the invention of this embodiment, the type of the gas for plasma generation is not limited and may be a gas containing at least one of, for example, $CF_4$, $CHF_3$, $CH_2F_2$, $CH_3F$, $C_4F_8$, $C_5F_8$, $C_4F_6$ and $C_2F_6$.

Embodiment 3

Figure 6:
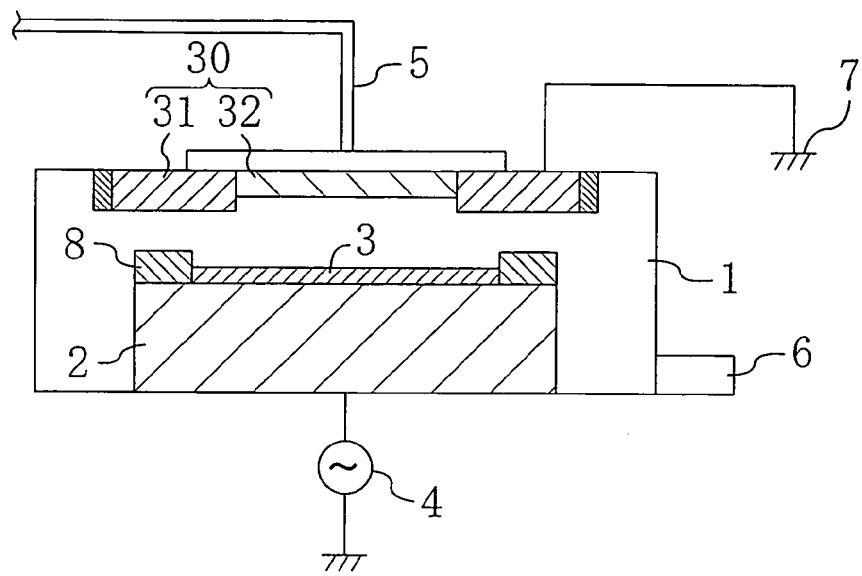
FIG. 6 is a schematic view showing the structure of a dry etching apparatus according to a third embodiment.

A dry etching apparatus and method according to a third embodiment of the present invention will be described hereinafter with reference to the drawings. Etching for forming a contact hole in an oxide film will be described below as an example. FIG. 6 is a schematic view showing the structure of a dry etching apparatus according to the third embodiment. In FIG. 6, the same reference numerals are given to the same members as those of the dry etching apparatus shown in FIG. 1 of the first embodiment. A description is not given of the members herein.

The third embodiment is different from the first embodiment in the structure of an upper electrode 30. The upper electrode 30 is composed of two electrodes: a middle part 32 having a thickness of 20 mm and an outside diameter of 10 cm and a doughnut-shaped peripheral part 31 surrounding the side surface of the middle part 32 and having a thickness of 20 mm and an outside diameter of 20 cm. The distance between each of the middle part 32 and peripheral part 31 and a lower electrode 2 can be controlled independently.

In this embodiment, the upper electrode 30 is made of a material having silicon as the main component. Although not shown in FIG. 6, a silicon oxide film to be etched is formed on a to-be-processed substrate 3, for example, with a silicon nitride film interposed therebetween.

Next, a dry etching method using the above-mentioned dry etching apparatus will be described specifically again with reference to FIG. 6. First, a fluorocarbon gas (reactive gas) such as $C_4F_8$, $C_5F_8$ or $CF_4$, an Ar gas and an oxygen gas are supplied into a gas inlet 5. Then, voltage is applied to a lower electrode 2, thereby generating plasma made of these gases. An oxide film over a to-be-processed substrate 3 is then etched. Specific etching conditions in this case are, for example, as follows: the flow rate of $C_4F_8$ is 10 ml/min (under standard conditions); the $O_2$ flow rate is 5 ml/min (under standard conditions); the Ar flow rate is 400 ml/min (under standard conditions); the pressure in the chamber is 7 Pa; the RF power for plasma generation is 1500 W; and the substrate temperature is 20° C.

Figure 7:
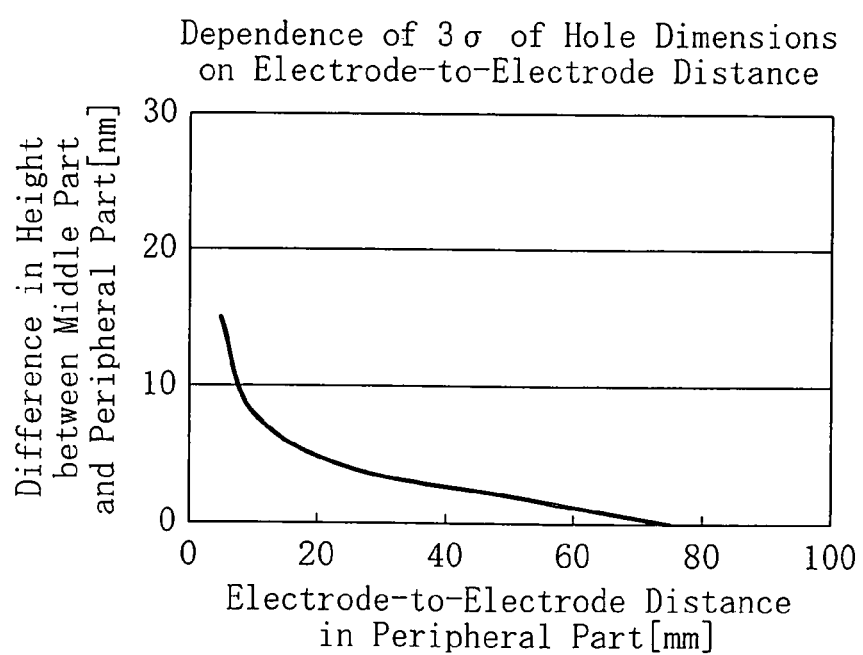
FIG. 7 is a graph showing the difference in height between a middle part 32 and peripheral part 31 of an upper electrode under the minimum 3σ of hole dimensions when etching is performed with the change in the distance between the peripheral part 31 and a lower electrode in the etching apparatus of the third embodiment.

Next, the accuracy of a hole formed by a dry etching method of this embodiment will be described with reference to FIG. 7. FIG. 7 is a graph showing, in the etching apparatus of this embodiment, the difference in height between the middle part 32 and the peripheral part 31 when 3σ of the hole dimensions is at a minimum in etching performed with the change in the distance of the peripheral part 31 from the lower electrode 2. In FIG. 7, the abscissa represents the distance between the peripheral part 31 and the lower electrode 2, and the ordinate represents a value obtained by subtracting the distance between the peripheral part 31 and the lower electrode 2 from the distance between the middle part 32 and the lower electrode 2 when 3σ of the bottom diameter of a hole after etching is at a minimum.

As shown in FIG. 7, the disparity between the peripheral part 31 and the middle part 32 at the minimum 3σ becomes larger with decrease in the distance between the peripheral part 31 and the lower electrode 2. In other words, the appropriate value of the difference in height between the peripheral part 31 and the central part 32 also becomes larger with change in the distance between the peripheral part 31 and the lower electrode 2. In this case, if as in this embodiment the distances from the middle part 32 and the peripheral part 31 to the lower electrode 2 can be controlled independently of each other, dimensional controllability can always be enhanced in accordance with the etching conditions. More particularly, the amount of further incident plasma particles can be uniform between the peripheral part 31 and the middle part 32.

In this embodiment, a description was given of the example in which the upper electrode 30 is composed of the peripheral part 31 having a thickness of 20 mm, an outside diameter of 20 cm and an inside diameter of 10 cm and the middle part 32 having a thickness of 20 mm and an outside diameter of 10 cm. However, in the invention of this embodiment, the number of components of the upper electrode 30 or the outside diameter of each component is not particularly limited.

Furthermore, in this embodiment, silicon is used as the main component of the upper electrode 30. However, the same effects as in this embodiment can be obtained even if the other materials are used as the main component.

In this embodiment, $C_4F_8$ is used as a reactive gas (gas for plasma generation) for oxide-film etching. However, in the invention of this embodiment, the type of the gas for plasma generation is not limited and may be a gas containing at least one of, for example, $CF_4$, $CHF_3$, $CH_2F_2$, $CH_3F$, $C_4F_8$, $C_5F_8$, $C_4F_6$ and $C_2F_6$.

Embodiment 4

Figure 8:
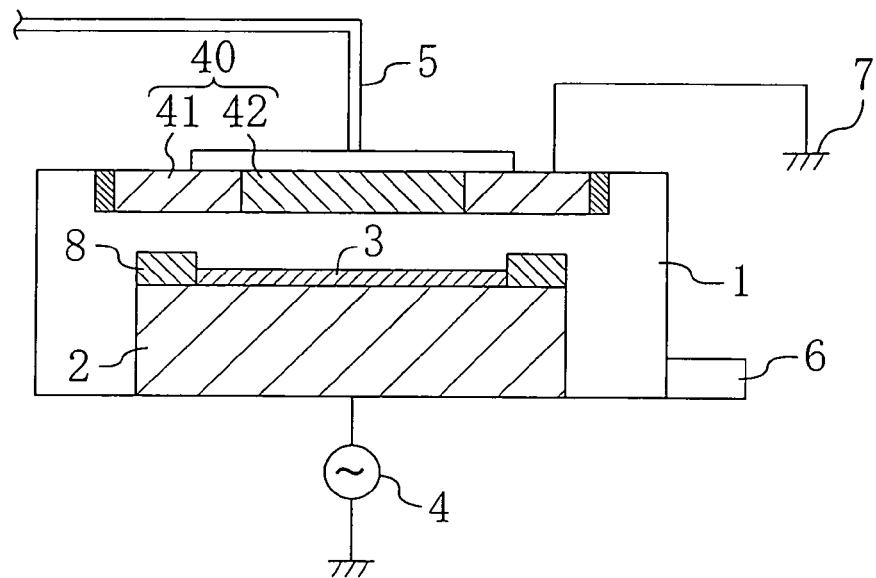
FIG. 8 is a schematic view showing the structure of a dry etching apparatus according to a fourth embodiment.

A dry etching apparatus and method according to a fourth embodiment of the present invention will be described hereinafter with reference to the drawings. Etching for an oxide film will be described below as an example. FIG. 8 is a schematic view showing the structure of a dry etching apparatus according to the fourth embodiment. In FIG. 8, the same reference numerals are given to the same members as those of the dry etching apparatus shown in FIG. 1 of the first embodiment. A description is not given of the members herein.

The fourth embodiment is different from the first embodiment in the structure of an upper electrode 40. The upper electrode 40 is composed of two electrodes: a middle part 42 having a thickness of 20 mm and an outside diameter of 10 cm and a doughnut-shaped peripheral part 41 surrounding the side surface of the middle part 42 and having a thickness of 20 mm and an outside diameter of 20 cm. The middle part 42 is made of a material having, as the main component, silicon carbide (SiC) with a low fluorine radical scavenging ability. The peripheral part 41 is made of a material having, as the main component, silicon with a high fluorine radical scavenging ability.

Although not shown in FIG. 8, a silicon oxide film to be etched is formed on a to-be-processed substrate 3, for example, with a silicon nitride film interposed therebetween.

Next, a dry etching method using the above-mentioned dry etching apparatus will be described specifically again with reference to FIG. 8. First, a fluorocarbon gas (reactive gas) such as $C_4F_8$, $C_5F_8$ or $CF_4$, an Ar gas and an oxygen gas are supplied into a gas inlet 5. Then, voltage is applied to a lower electrode 2, thereby generating plasma made of these gases. An oxide film over a to-be-processed substrate 3 is then etched. Specific etching conditions in this case are, for example, as follows: the flow rate of $C_4F_8$ is 10 ml/min (under standard conditions); the $O_2$ flow rate is 5 ml/min (under standard conditions); the Ar flow rate is 400 ml/min (under standard conditions); the pressure in the chamber is 7 Pa; the RF power for plasma generation is 1500 W; and the substrate temperature is 20° C.

Figure 9:
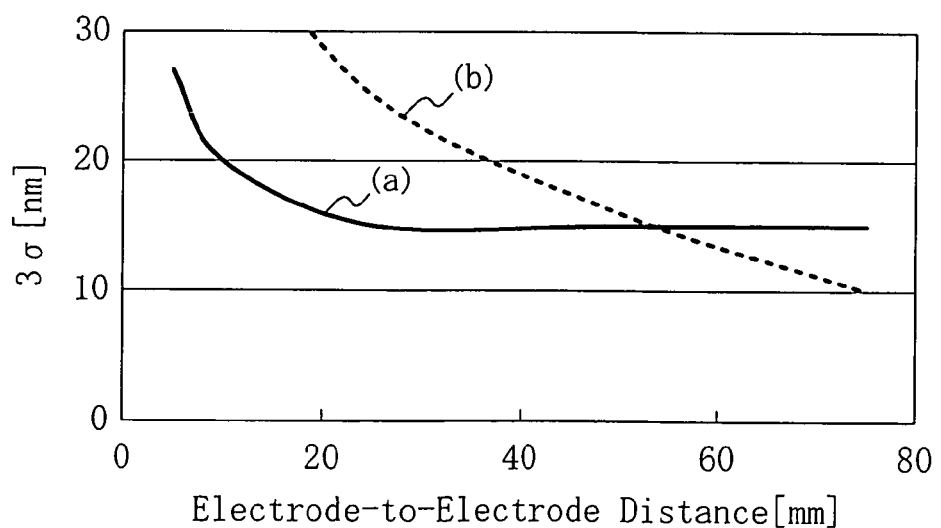
FIG. 9 is a graph showing how 3σ of hole dimensions varies when etching is performed with the change in the electrode-to-electrode distance in each of a known etching apparatus and an etching apparatus of the fourth embodiment.
Figure 10:
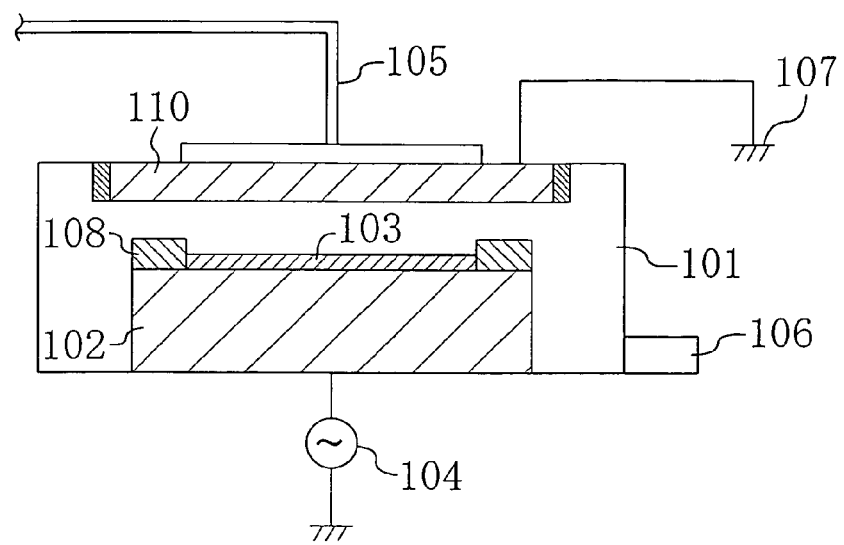
FIG. 10 is a schematic view showing the structure of a known dry etching apparatus used for etching of an oxide film or other films.
Figure 11:
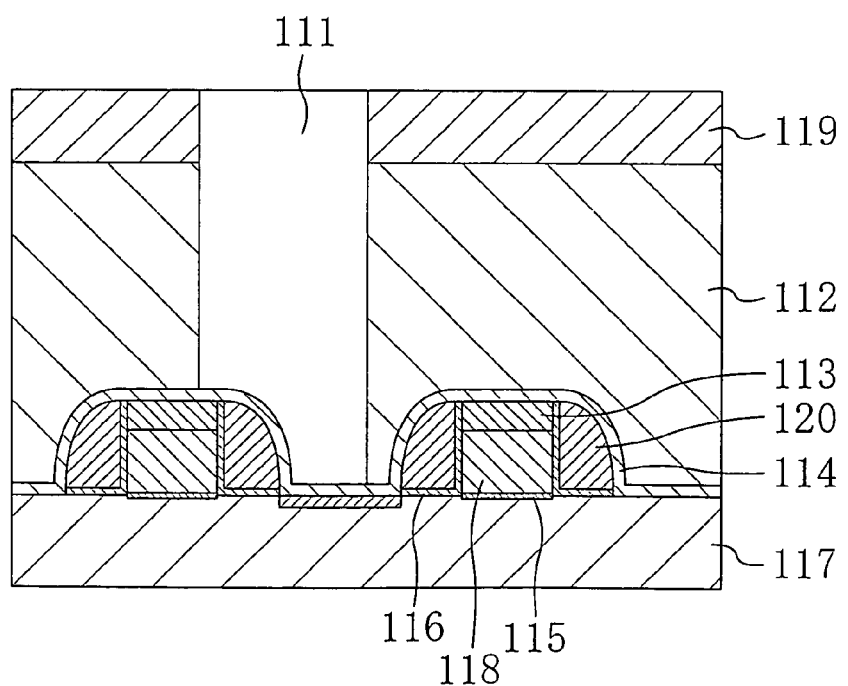
FIG. 11 is a cross-sectional view showing the state where a contact hole is formed partway to electrically connect an upper interconnect to a substrate between two of adjacent gate electrodes in an SRAM memory cell.
Figure 12A:
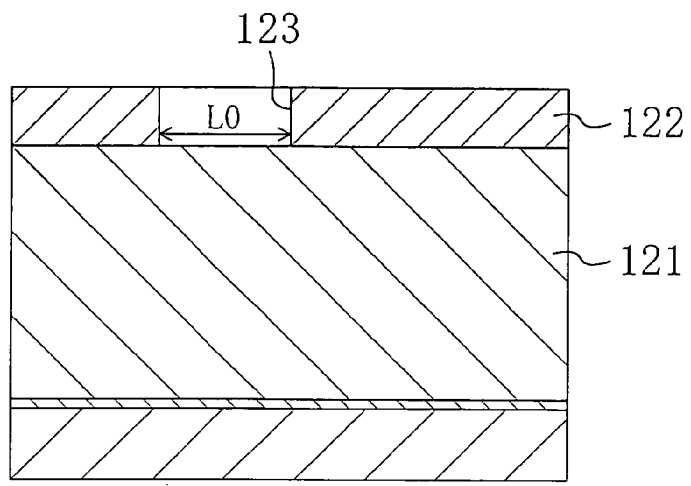
FIGS. 12A through 12C are cross-sectional views for explaining a problem on the formation of a contact hole on a large-diameter to-be-processed substrate under the use of an etching apparatus having a small electrode-to-electrode distance.
Figure 12B:
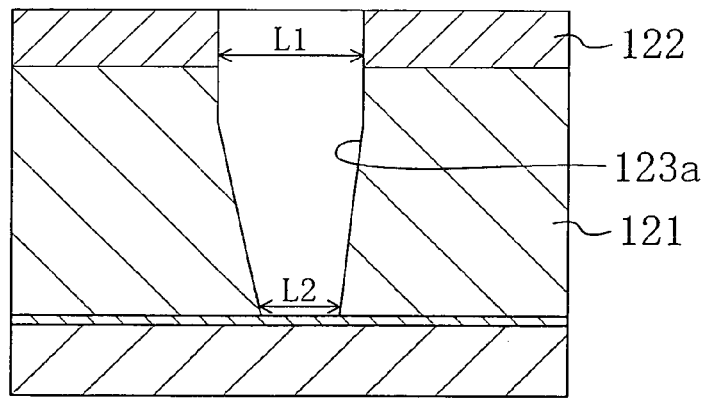
Figure 12C:
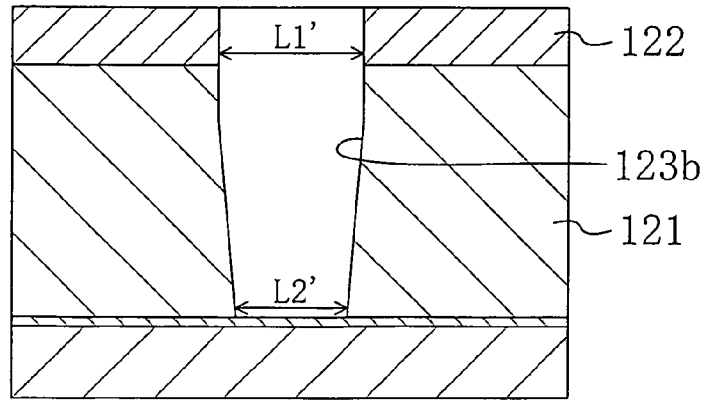
Figure 13:
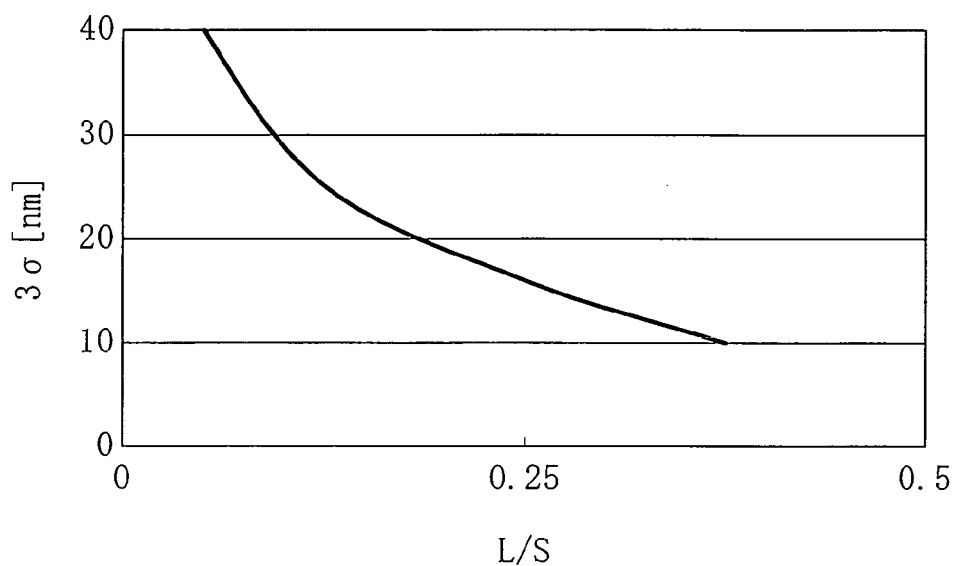
FIG. 13 is a graph illustrating the relationship between the ratio of an electrode-to-electrode distance L to the diameter S of a to-be-processed substrate and 3σ of hole dimensions in the known etching apparatus.

Next, the accuracy of a hole formed by a dry etching method of this embodiment will be described with reference to FIG. 9. FIG. 9 is a graph showing how 3σ of hole dimensions varies when etching is performed with the change in the electrode-to-electrode distance in each of a known etching apparatus and an etching apparatus of this embodiment. In FIG. 9, the abscissa represents the electrode-to-electrode distance between the upper electrode and the lower electrode, and the ordinate represents 3σ of the bottom diameter of a hole after etching. The curve (a) shows the result obtained by measuring 3σ in the etching apparatus of this embodiment, and the curve (b) shows the result obtained by measuring 3σ in the known etching apparatus. An etching apparatus having a flat-shaped upper electrode is used as the known etching apparatus.

When etching is performed using the known flat-shaped upper electrode, as shown in the curve (b) in FIG. 9, 3σ increases with the decrease in the electrode-to-electrode distance. On the other hand, when etching is performed using the upper electrode 40 of this embodiment, as shown in the curve (a) in FIG. 9, even an electrode-to-electrode distance of approximately 10 mm can provide an excellent value of 3σ. In this way, it can be found that even if the electrode-to-electrode distance becomes short, the shape of the hole can be controlled. The reason for this is as follows.

In the plasma, the gases introduced into the reaction chamber 1 are dissociated, thereby generating $C_xF_y$ radicals (fluorocarbon radicals) serving as a deposition species and F radicals (fluorine radicals) serving as an etchant. These radical particles include those reacting on the to-be-processed substrate 3, those reflected by the to-be-processed substrate 3 and delivered to the outside of the chamber, and those which are reflected by the upper electrode 40 after being reflected by the to-be-processed substrate 3 and are again incident on the to-be-processed substrate 3 or delivered to the sides of the to-be-processed substrate 3.

Conventionally, the proportion of particles that are again incident on the to-be-processed substrate becomes larger at the middle part of the to-be-processed substrate than at the peripheral part thereof. In this case, the difference in the amount of further incident particles between the peripheral and middle parts of the to-be-processed substrate depends on the ratio between the electrode-to-electrode distance and an electrode radius. The electrode radius means the radius of an electrode having a smaller radius out of the upper and lower electrodes and represents the radius of the lower electrode herein. That is, the difference in the amount of further incident particles increases with reduction in the electrode-to-electrode distance or with increase in the electrode radius. Therefore, in particular, when the electrode-to-electrode distance is wider than the electrode radius, the difference in the amount of further incident particles becomes large.

On the other hand, since in this embodiment the peripheral part 41 of the upper electrode 40 has a higher scavenging effect than the middle part 42 thereof, a collision of radicals with the upper electrode 40 removes a larger proportion of radicals in the peripheral part 41 than in the middle part 42. Therefore, the amount of radicals that are again incident from the upper electrode 40 to the peripheral part of the to-be-processed substrate 3 can be reduced as compared with the known etching apparatus, and the ratio between a deposition species and an etchant can be made uniform between the peripheral part 41 and the middle part 42. In this way, the difference in the degree of the influence of the further incidence of plasma particles between the peripheral part 41 and the middle part 42 can be cancelled out. Therefore, a desired etching shape can be realized while an excellent controllability of the hole dimensions after etching is always kept.

Furthermore, since in this embodiment the upper electrode 40 consisting of the peripheral part 41 and the middle part 42 has a flat lower surface, there is no possibility that projections or depressions of the upper electrode 40 may cause the convection of plasma particles.

In the fourth embodiment, it was assumed that the peripheral part 41 of the upper electrode 40 is made of a material having, as the main component, silicon with a high fluorine radical scavenging ability. Furthermore, it was assumed that the middle part 42 of the upper electrode 40 is made of a material having, as the main component, SiC with a low fluorine radical scavenging ability. However, in the invention of this embodiment, the number, the dimensions and materials of components of the upper electrode 40 are not particularly limited.

In this embodiment, $C_4F_8$ is used as a reactive gas (gas for plasma generation) for oxide-film etching. However, in the invention of this embodiment, the type of the gas for plasma generation is not particularly limited and may be a gas containing at least one of, for example, $CF_4$, $CHF_3$, $CH_2F_2$, $CH_3F$, $C_4F_8$, $C_5F_8$, $C_4F_6$ and $C_2F_6$. Alternatively, a Cl-based gas or Br-based gas (for example, HBr) may be used as a gas for plasma generation.

What is claimed is:

1. A dry etching apparatus comprising:
a reaction chamber;
a lower electrode placed in the reaction chamber;
an upper electrode placed in the reaction chamber to face the lower electrode; and
a substrate-fixing member composed of a ring placed in the reaction chamber and on the surface of the lower electrode facing the upper electrode, said substrate-fixing member allowing a to-be-processed substrate to be fixed inside the ring,
wherein the surface of the upper electrode facing the lower electrode is provided with a recess with a smaller inside diameter than that of the substrate-fixing member, and
the depth and the inside diameter of the recess is provided respectively so that the amount of a further incident of plasma particles caused by etching to the to-be-processed substrate onto the to-be-processed substrate is made uniform on the surface of the to-be-processed substrate.

2. The dry etching apparatus of claim 1, wherein the distance between the upper electrode and the lower electrode is shorter than the smaller of the radii of the upper and lower electrodes.

3. A dry etching apparatus comprising:
a reaction chamber;
a lower electrode placed in the reaction chamber;
an upper electrode placed in the reaction chamber to face the lower electrode; and
a substrate-fixing member composed of a ring placed in the reaction chamber and on the surface of the lower electrode facing the upper electrode, said substrate-fixing member allowing a to-be-processed substrate to be fixed inside the ring,
wherein the surface of the upper electrode facing the lower electrode is provided with a recess with a smaller inside diameter than that of the substrate-fixing member, and
the recess has a dome shape in which the depth becomes shallower with increase in distance from the center of the upper electrode.

4. A dry etching apparatus comprising;
a reaction chamber;
a lower electrode placed in the reaction chamber;
an upper electrode placed in the reaction chamber to face the lower electrode; and
a substrate-fixing member composed of a ring placed in the reaction chamber and on the surface of the lower electrode facing the upper electrode, said substrate-fixing member allowing a to-be-processed substrate to be fixed inside the ring, wherein the surface of the upper electrode facing the lower electrode is provided with a recess with a smaller inside diameter than that of the substrate-fixing member, the upper electrode has a middle part and a peripheral part surrounding the side face of the middle part, said middle and peripheral parts permitting adjustment of their distances from the lower electrode independently of each other, and the recess is provided by making the distance between the middle part and the lower electrode longer than the distance between the peripheral part and the lower electrode.

5. A dry etching apparatus comprising:

a reaction chamber;

a lower electrode placed in the reaction chamber;

an upper electrode placed in the reaction chamber to face the lower electrode; and a substrate-fixing member composed of a ring placed in the reaction chamber and on the surface of the lower electrode facing the upper electrode, said substrate-fixing member allowing a to-be-processed substrate to be fixed inside the ring, wherein the surface of the upper electrode facing the lower electrode is provided with a recess with a smaller inside diameter than that of the substrate-fixing member, and the dry etching apparatus is used under the condition that the time of residence of an etching gas in the reaction chamber is longer than the period during which plasma particles caused by etching are again incident on the lower electrode.

6. The dry etching apparatus of claim 1, wherein the upper electrode is made of at least one substance of silicon (Si), quartz ($SiO_2$), silicon carbide (SiC), aluminum oxide ($Al_2O_3$), aluminum (Al) and yttrium oxide ($Y_2O_3$).

7. A dry etching method using a dry etching apparatus comprising:

a reaction chamber;

a lower electrode placed in the reaction chamber;

an upper electrode placed in the reaction chamber to face the lower electrode; and a substrate-fixing member composed of a ring placed in the reaction chamber and on the surface of the lower electrode facing the upper electrode, said substrate-fixing member allowing a to-be-processed substrate to be fixed inside the ring.

wherein the surface of the upper electrode facing the lower electrode is provided with a recess with a smaller inside diameter than that of the substrate-fixing member, and said method comprising the steps of (a) mounting the to-be-processed substrate on the substrate-fixing member; and (b) performing dry etching by generating plasma between the upper electrode and the lower electrode with an etching gas introduced into the reaction chamber, wherein the dry etching method further comprises, before the step (b), the step of adjusting the distance between the upper electrode and the lower electrode in accordance with the time of residence of the etching gas and the period during which plasma particles caused by etching are again incident on the lower electrode.

8. A dry etching apparatus comprising:

a reaction chamber;

a lower electrode placed in the reaction chamber;

an upper electrode placed in the reaction chamber to face the lower electrode; and a substrate-fixing member composed of a ring placed in the reaction chamber and on the surface of the lower electrode facing the upper electrode, said substrate-fixing member allowing a to-be-processed substrate to be fixed inside the ring, wherein the upper electrode comprises a middle part having a smaller diameter than the inside diameter of the substrate-fixing member and a peripheral part made of a material exhibiting a higher etchant scavenging ability than that of the middle part, said peripheral part surrounding the side surface of the middle part.

9. The dry etching apparatus of claim 8, wherein the dry etching apparatus is used under the condition that the time of residence of an etching gas in the reaction chamber is longer than the period during which plasma particles caused by etching are again incident on the lower electrode.

10. The dry etching apparatus of claim 8, wherein the upper electrode is made of at least one substance of silicon (Si), quartz ($SiO_2$), silicon carbide (SiC), aluminum oxide ($Al_2O_3$), aluminum (Al) and yttrium oxide ($Y_2O_3$).

11. A dry etching method using the dry etching apparatus of claim 8, said method comprising the steps of:

(a) mounting the to-be-processed substrate on the substrate-fixing member; and (b) performing dry etching by generating plasma between the upper electrode and the lower electrode with an etching gas introduced into the reaction chamber, wherein the dry etching method further comprises, before the step (b), the step of adjusting the distance between the upper electrode and the lower electrode in accordance with the time of residence of the etching gas and the period during which plasma particles caused by etching are again incident on the lower electrode.

* * * * *